(12) United States Patent
Suzuki

(10) Patent No.: US 7,515,187 B2
(45) Date of Patent: Apr. 7, 2009

(54) PHOTOELECTRIC CONVERSION FILM-STACKED TYPE SOLID-STATE IMAGING DEVICE

(75) Inventor: Nobuo Suzuki, Miyagi (JP)

(73) Assignee: Fujifilm Corporation, Tokyo (JP)

(*) Notice: Subject to any disclaimer, the term of this patent is extended or adjusted under 35 U.S.C. 154(b) by 818 days.

(21) Appl. No.: 11/081,763

(22) Filed: Mar. 17, 2005

(65) Prior Publication Data
US 2005/0206767 A1 Sep. 22, 2005

(30) Foreign Application Priority Data
Mar. 18, 2004 (JP) ............ P.2004-077693

(51) Int. Cl.
*H04N 5/335* (2006.01)
(52) U.S. Cl. .................... 348/296; 348/297
(58) Field of Classification Search ........... 348/296, 348/297, 311–319
See application file for complete search history.

(56) References Cited

U.S. PATENT DOCUMENTS

| | | | |
|---|---|---|---|
| 4,438,455 A | | 3/1984 | Tabei |
| 4,878,102 A | * | 10/1989 | Bakker et al. ............. 257/215 |
| 5,122,850 A | * | 6/1992 | Burkey ..................... 257/230 |
| 5,177,614 A | * | 1/1993 | Kawaoka et al. ........... 348/321 |
| 5,990,953 A | * | 11/1999 | Nakashiba ................ 348/314 |
| 6,239,453 B1 | | 5/2001 | Yamada et al. |
| 6,300,612 B1 | | 10/2001 | Yu |
| 6,730,934 B2 | | 5/2004 | Yamada et al. |
| 2002/0003201 A1 | | 1/2002 | Yu |
| 2002/0101895 A1 | | 8/2002 | Augusto |
| 2004/0056180 A1 | | 3/2004 | Yu |

FOREIGN PATENT DOCUMENTS

| | | |
|---|---|---|
| JP | 58-103165 A | 6/1983 |
| JP | 2002-502120 A | 1/2002 |
| JP | 2002-83946 A | 3/2002 |
| JP | 2003-502847 A | 1/2003 |
| JP | 3405099 B2 | 3/2003 |

* cited by examiner

*Primary Examiner*—Tuan V Ho
(74) *Attorney, Agent, or Firm*—Birch, Stewart, Kolasch & Birch, LLP

(57) ABSTRACT

A solid-state imaging device is provided in which noise caused by fluctuation of potential of a readout pulse is prevented from being superposed on the amount of signal charges even if the potential of the readout pulse fluctuates. The solid-state imaging device includes: a semiconductor substrate having a charge-storage region and a signal readout circuit having a charge coupled element; and a photoelectric conversion film converting incident light into signal charges in accordance with the intensity of the incident light, the signal charges being accumulated in the signal charge-storage region and read out by the signal readout circuit; and a potential barrier unit provided around a connection portion for passing the signal charges through the signal charge-storage region so that the potential barrier unit serves as a potential barrier against charges in the wiring connection portions.

13 Claims, 11 Drawing Sheets

PHOTOELECTRIC CONVERSION FILM-STACKED TYPE SOLID-STATE IMAGING DEVICE

FIELD OF THE INVENTION

The present invention relates to a photoelectric conversion film-stacked type solid-state imaging device in which photoelectric conversion films for generating charges in accordance with the intensity of received light are stacked on a semiconductor substrate, and particularly relates to a photoelectric conversion film-stacked type solid-state imaging device in which signal charges generated by photoelectric conversion films are read out to the outside by charge transfer channels circuits formed on a semiconductor substrate.

BACKGROUND OF THE INVENTION

In a CCD type solid-state imaging device or a CMOS type solid-state imaging device mounted in a digital camera, a large number of photoelectric conversion devices (photodiodes) serving as photo acceptance portions and signal readout circuits for reading out photoelectric conversion signals obtained by the photoelectric conversion devices to the outside are formed on a surface of a semiconductor substrate. In the CCD type solid-state imaging device, each of the signal readout circuits includes a charge transfer circuit, and a transfer electrode. In the CMOS type solid-state imaging device, each of the signal readout circuits includes an MOS circuit, and a signal wiring.

Accordingly, in the solid-state imaging device according to the related art, both the large number of photo acceptance portions and the signal readout circuits have to be formed together on the surface of the semiconductor substrate. There is a problem that the total area of the photo acceptance portions cannot be enlarged.

In addition, in a single plate type solid-state imaging device according to the related art, one of color filters, for example, of red (R), green (G) and blue (B) is stacked on each photo acceptance portion so that each photo acceptance portion can detect an optical signal with corresponding one of the colors. For this reason, for example, a blue optical signal and a green optical signal in a position of a photo acceptance portion for detecting red light are obtained by applying an interpolation operation on detection signals of surrounding photo acceptance portions for detecting blue light and green light. This causes false colors to thereby result in lowering of resolution. In addition, blue and green light beams incident on a photo acceptance portion covered with a red color filter are absorbed as heat to the color filter without giving any contribution to photoelectric conversion. For this reason, there is also another problem that light utilization efficiency deteriorates and sensitivity is lowered.

While the solid-state imaging device according to the related art has various problems as described above, development on increase in the number of pixels has advanced. At present, a large number of photo acceptance portions (e.g. equivalent to several million pixels) are integrated on one chip of a semiconductor substrate, so that the size of an aperture of each photo acceptance portion approaches the wavelength of light. Accordingly, it is difficult to expect a CCD type or CMOS type image sensor to have better image quality or sensitivity than ever to thereby solve the abovementioned problems.

Under such circumstances, the structure of a solid-state imaging device, for example, described in JP-A-58-103165 has been reviewed. The solid-state imaging device has a structure in which a photosensitive layer for detecting red light, a photosensitive layer for detecting green light and a photosensitive layer for detecting blue light are stacked on a semiconductor substrate having signal readout circuits formed in its surface, by a film-forming technique and in which these photosensitive layers are provided as photo acceptance portions so that photoelectric conversion signals obtained by the photosensitive layers can be taken out to the outside by the signal readout circuits. That is, the solid-state imaging device has a photoelectric conversion film-stacked type structure.

According to the structure, limitation on design of the signal readout circuits can be reduced greatly because it is unnecessary to provide any photo acceptance portion on the surface of the semiconductor substrate. Moreover, sensitivity can be improved because efficiency in utilization of incident light is improved. In addition, resolution can be improved because light with the three primary colors of red, green and blue can be detected from one pixel. The problem of false colors can be eliminated. The problems inherent to the CCD type or CMOS type solid-state imaging device according to the related art can be solved.

Therefore, photoelectric conversion film-stacked type solid-state imaging devices described in JP-A-2002-83946, JP-T-2002-502120, JP-T-2003-502841 and JP-B-3405099 have been proposed in recent years. An organic semiconductor or nano particles may be used as the material of each photosensitive layer.

However, when one of such photoelectric conversion film-stacked type solid-state imaging devices is used, the structure of the semiconductor substrate where the signal readout circuit is formed is not good enough for capturing a high-resolution still image, so that there is a problem that noise is often superposed on the readout signal. This problem will be described with reference to FIGS. 13A to 13C.

FIG. 13A is a typical sectional view of main part in a surface portion of a semiconductor substrate, in which a charge-coupled element type of charge transfer channel is used as a signal readout circuit. A signal charge-storage portion 2 made of an n-type semiconductor region is provided in a surface portion of a semiconductor substrate 1. A charge transfer channel 3 made of an n-type semiconductor region is provided in the surface portion of the semiconductor substrate 1 so as to be separate from the signal charge-storage portion 2. The outmost surface of the semiconductor substrate 1 is covered with an electrically insulating film 4. A columnar wiring electrode 5 piercing the electrically insulating film 4 is provided so as to be erected from the signal charge-storage portion 2 and connected to a corresponding electrode (not shown) of a photoelectric conversion film. A transfer electrode (readout electrode) 6 bridging between the signal charge-storage region 2 and the charge transfer channel 3 is provided on the surface of the electrically insulating film 4.

FIG. 13B is a view showing a potential well in the configuration depicted in FIG. 13A. Since the columnar wiring electrode 5 is integrally connected to the signal charge-storage portion 2, a large number of free electrons QB are present in a well 7 formed under the signal charge-storage portion 2. Signal charges Qsig generated by photoelectric conversion flow through the wiring electrode 5 onto the free electrons QB.

When a readout pulse is applied to the transfer electrode 6, a barrier 9 between a well 8 under the charge transfer channel 3 and the well 7 is moved down as shown in FIG. 13C so that the signal charges Qsig are transferred from the well 7 to the well 8. Then, the signal charges Qsig are read out. As a result, only the free electrons QB remain in the well 7.

If the free electrons QB in the well 7 are always constant, that is, if the potential of the potential barrier 9 at the time of application of the readout pulse is always constant, no problem will be caused. When the potential V1 of the readout pulse applied to the transfer electrode 6 fluctuates by ΔV1 during reading out of the signal charges Qsig, the free electrons QB may be partially transferred into the well 8 so that there is a problem that the transferred free electrons QB are superposed as noise on signal charges.

As described above, the photoelectric conversion film-stacked type solid-state imaging device has such a problem that a large number of free electrons present in a wiring electrode portion for connecting an electrode of a photoelectric conversion film and a signal charge-storage portion to each other are read out as noise together with signal charges into a charge transfer channel because of potential fluctuation of a readout pulse. If the photoelectric conversion film-stacked type solid-state imaging device is mounted in a digital camera etc. while the problem remains unsolved, it is impossible to capture a high-resolution and high-quality still image.

Since an overflow drain structure for achieving an electronic shutter is not provided in the photoelectric conversion film-stacked type solid-state imaging device according to the related art, it is necessary to make a research on how to include the structure in the photoelectric conversion film-stacked type solid-state imaging device according to the related art.

SUMMARY OF THE INVENTION

An object of the invention is to a photoelectric conversion film-stacked type solid-state imaging device provided with a structure, wherein noise on the amount of signal charges read out into transfer channels can be prevented from being increased due to fluctuation in potential of a readout pulse even if the potential of the readout pulse fluctuates.

Another object of the invention is to provide a photoelectric conversion film-stacked type solid-state imaging device provided with an overflow drain structure for achieving an electronic shutter function.

According to the invention, there is provided a solid-state imaging device including: a semiconductor substrate having a signal charge-storage region and a signal readout circuit, the signal readout circuit comprising a charge coupled element; a photoelectric conversion film that converts an incident light into a signal charge in accordance with an intensity of the incident light, wherein the signal charge-storage region accumulates the signal charge, and the signal readout circuit reads out and outputs the signal charge; a wiring electrode that leads the signal charge from the photoelectric conversion film to the signal charge-storage region; a connection portion that connects the wiring electrode to the signal charge-storage region; and a potential barrier unit disposed at the periphery of the connection portion, the potential barrier unit serving as a potential barrier against a charge in the connection portion.

According to this configuration, even when the potential of a readout pulse fluctuates, noise caused by the fluctuation of the potential of the readout pulse can be prevented from being mixed with the amount of the signal charge read out on the basis of the readout pulse because a large number of free electrons present in each wiring electrode can be held by the potential barrier.

The solid-state imaging device according to the invention further includes a charge draining unit disposed near to the signal charge-storage regions for draining the signal charge accumulated in the signal charge-storage region.

According to this configuration, an electronic shutter function can be achieved.

In the solid-state imaging device according to the invention, the charge draining unit has one of a lateral overflow drain structure and a vertical overflow drain structure.

This invention can be applied to any one of the lateral overflow drain structure and the vertical overflow drain structure.

In the solid-state imaging device according to the invention, the potential barrier units are formed in such a manner that an impurity of an electric conductivity type opposite to the electric conductivity type of the connection portion and the signal charge-storage region is injected into portions at the periphery of the connection portion so as to form an impurity portion.

According to this configuration, it is easy to form and control the potential barrier.

In the solid-state imaging device according to the invention, the signal charge-storage region includes: a body storing the signal charge; and a charge path that leads the signal charge to the body, wherein the charge path overlaps the impurity portion near the connection portion, and the charge path has a thickness smaller than that of the body so that the charge accumulated in the connection portion are held by the potential barrier in the charge path.

According to this configuration, it is possible to provide the potential barrier to more surely prevent movement of free electrons while it is possible to read out the signal charge easily and rapidly. The after-image phenomenon can be suppressed.

In the solid-state imaging device according to the invention, the signal readout circuit includes: a set of column-direction (vertical-direction) CCD registers, each of the column-direction CCD registers including a readout electrode that reads out signal charge from the signal charge-storage region, and a transfer channel that transfers the signal charge sequentially in a column direction of the column-direction CCD registers; a row-direction (horizontal-direction) CCD register that receives the signal charge from each of the column-direction CCD registers and transfers the signal charge sequentially in a row direction of the row-direction CCD register; and an output portion located at one end of the row-direction CCD register for detecting the signal charge transferred from the row-direction CCD register and outputting the signal charge as an output signal.

According to this configuration, the structure of the vertical transfer channels and the horizontal transfer channel used in the CCD type image sensor according to the related art can be used.

In the solid-state imaging device according to the invention, a plurality of photo acceptance portions are arranged in a planar array on a surface portion of the solid-state imaging device. The solid-state imaging device includes a plurality of sets of layered products, wherein the sets of the layered products are stacked in a direction perpendicular to a surface of the semiconductor substrate, each of the layered products including: a common electrode film to pixels; a plurality of pixel electrode films arranged in the planar array, each of the pixel electrode films being partitioned in accordance with one of the pixels; and the photoelectric conversion film between the common electrode film and the pixel electrode films arranged in the planar array. The photoelectric conversion film of each of the layered products detects the incident light differing in wavelength between the layered products. The pixel electrode films in each position of the planar array are arranged in a line with respect to an incidence direction of the incident light, and the pixel electrode films in each position of the planar array form one partition unit of the photo acceptance portions.

According to this configuration, it is possible to detect a plurality of colors simultaneously in one photo acceptance portion so that it is possible to improve resolution and light utilization efficiency, suppress false colors and increase sensitivity. Thus, the problems inherent to the CCD type or CMOS type image sensor according to the related art can be solved.

In the solid-state imaging device according to the invention, the semiconductor substrate has a plurality of sets of signal charge-storage regions; each of the sets of the signal charge-storage regions is disposed under one of the photo acceptance portions, and the signal charge-regions in each of the sets are arranged in a sequence with respect to the column direction; each of the signal charge-storage regions accumulates the signal charge in accordance with a detection color of the photoelectric conversion film, and the signal charge-storage regions in each of the sets differ in the detection color from each other; and one of the column-direction CCD registers reads out the signal charge accumulated in one of the sets of the signal charge-storage regions.

According to this configuration, it is unnecessary to provide column-direction CCD registers in accordance with detection colors. Transfer capacity of column-direction CCD registers can be increased.

In the solid-state imaging device according to the invention, the sequence of the signal charge-storage regions arranged in the column direction is common to the photo acceptance portions.

According to this configuration, it is easy to design the column-direction registers and the transfer electrodes (readout electrodes).

In the solid-state imaging device according to the invention, the sequence of the signal charge-storage regions arranged in the column direction is changed cyclically with respect to the photo acceptance portions arranged in the row direction.

According to this configuration, it is possible to read out different color signal charges simultaneously from signal charge-storage regions in each column of one row. Accordingly, it is possible to improve image quality when motion picture data are generated and it is possible to shorten the readout time of the motion picture data.

In the solid-state imaging device according to the invention, photoelectric conversion films in the sets of the layered products include a first photoelectric conversion film having a peak of spectral sensitivity characteristic at red, a second photoelectric conversion film having a peak of spectral sensitivity characteristic at green, and a third photoelectric conversion film having a peak of spectral sensitivity characteristic at blue.

According to this configuration, it is possible to capture a color image based on the three primary colors and it is possible to use an existing signal processing circuit for R (red color), G (green color) and B (blue color) signals.

According to the invention, it is possible to provide a photoelectric conversion film-stacked type solid-state imaging device in which noise caused by fluctuation of the potential of a readout pulse can be prevented from being superposed on the amount of signal charges even if the readout pulse fluctuates.

DETAILED DESCRIPTION OF THE INVENTION

An embodiment of the invention will be described below with reference to the drawings.

First Embodiment

Figure 1:
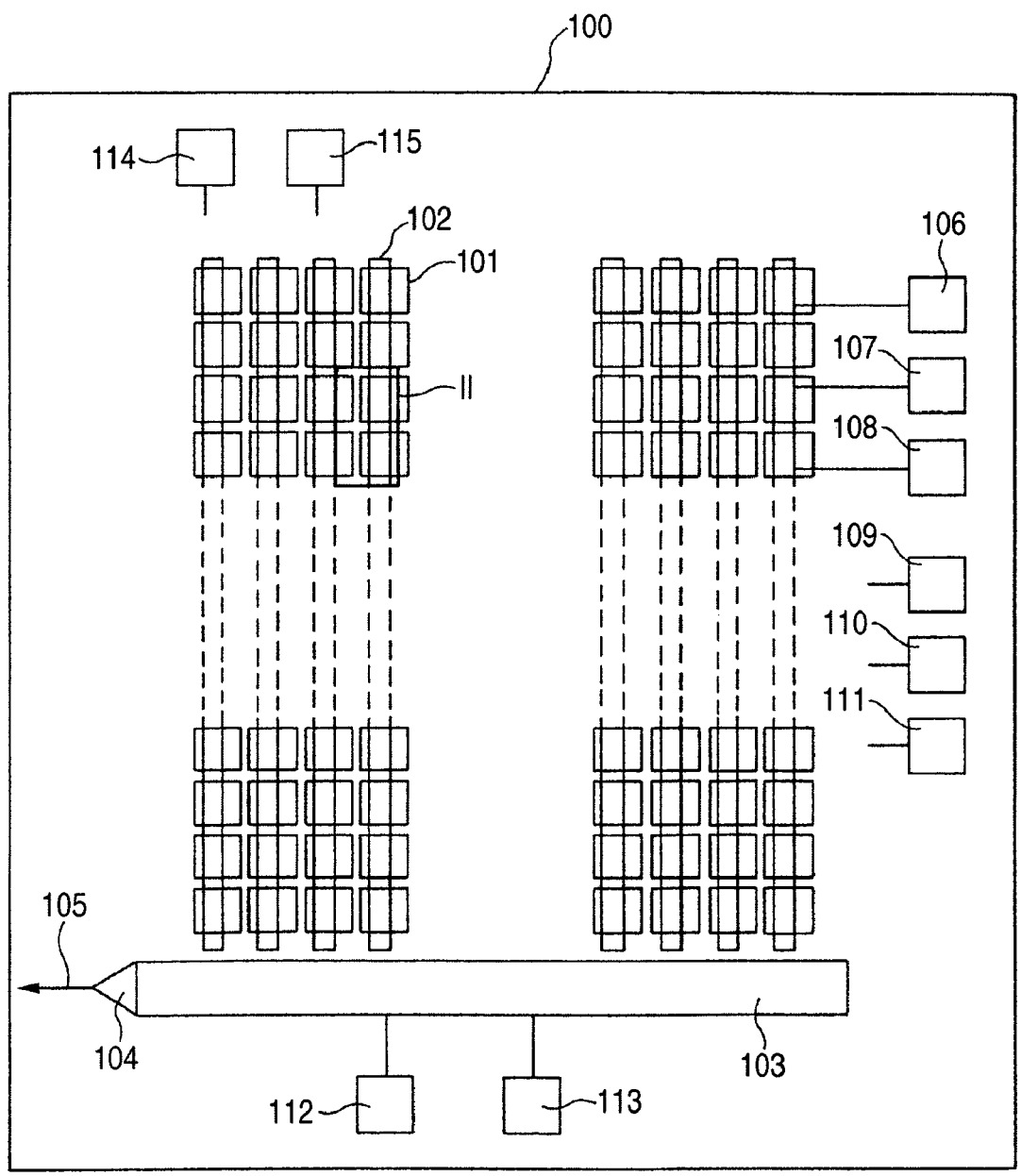
FIG. 1 is a typical view of a surface of a solid-state imaging device according to a first embodiment of the invention.

FIG. 1 is a typical view showing a surface of a solid-state imaging device according to a first embodiment of the invention. The solid-state imaging device 100 includes a plurality of photo acceptance portions 101 (each corresponding to a pixel). In this embodiment, the photo acceptance portions 101 are arranged in the form of a tetragonal lattice. In a surface of a semiconductor substrate provided under the photo acceptance portions 101 of the solid-state imaging device 100, vertical transfer channels (column-direction CCD registers) 102 are formed in positions where the vertical transfer channels 102 overlap the photo acceptance portions 101 arranged in a column direction of the vertical transfer channels 102. A horizontal transfer channel (row-direction CCD register) 103 is formed in a lower side portion of the semiconductor substrate.

An amplifier (an output portion) 104 is provided in an exit of the horizontal transfer channel 103. Single charges detected by each of the photo acceptance portions 101 are first transferred to the horizontal transfer channel 103 by the vertical transfer channels (charge transfer channels) 102 and then transferred to the amplifier 104 by the horizontal transfer channel 103, so that the signal charges are output as output signals 105 from the amplifier 104.

Electrode terminals 106, 107 and 108 connected to not-shown transfer electrodes provided so as to overlap the vertical transfer channels 102, electrode terminals 109, 110 and 111 connected to common electrodes (which will be described later) of the photo acceptance portions 101, transfer electrode terminals 112 and 113 of the horizontal transfer channel 103, an overflow drain electrode terminal 114 and a charge draining control electrode terminal 115 are provided in the surface of the semiconductor substrate.

Figure 2:
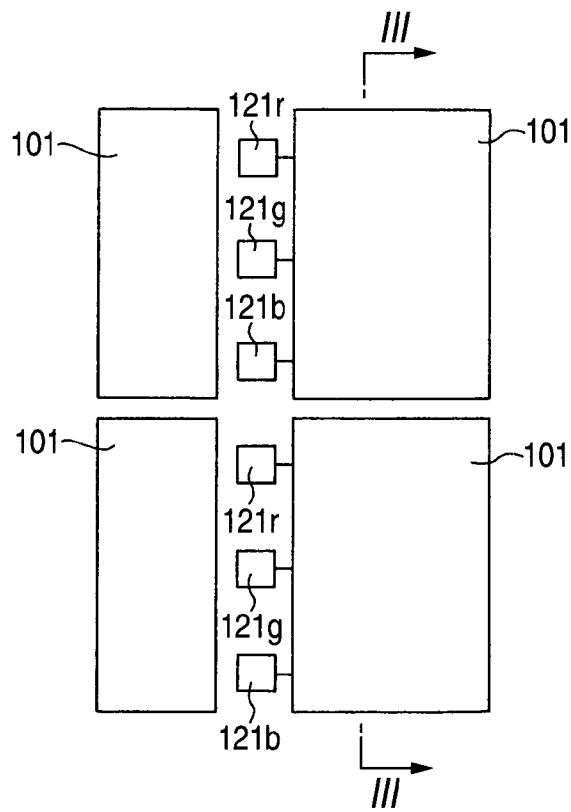
FIG. 2 is a typical enlarged view of a portion enclosed in a rectangular frame II shown in FIG. 1.

FIG. 2 is an enlarged typical view showing a portion enclosed in a rectangular frame II depicted in FIG. 1, that is, an enlarged view of four photo acceptance portions 101 partially extracted from FIG. 1. In this embodiment, three connection portions 121r, 121g and 121b are provided between one of photo acceptance portions 101 arranged in a column and corresponding one of photo acceptance portions 101 arranged in an adjacent column. Incidentally, a suffix r, g or b corresponds to red (R) green (G) or blue (B) which is the color of incident light to be detected. The same rule applies to the following description.

Figure 3:
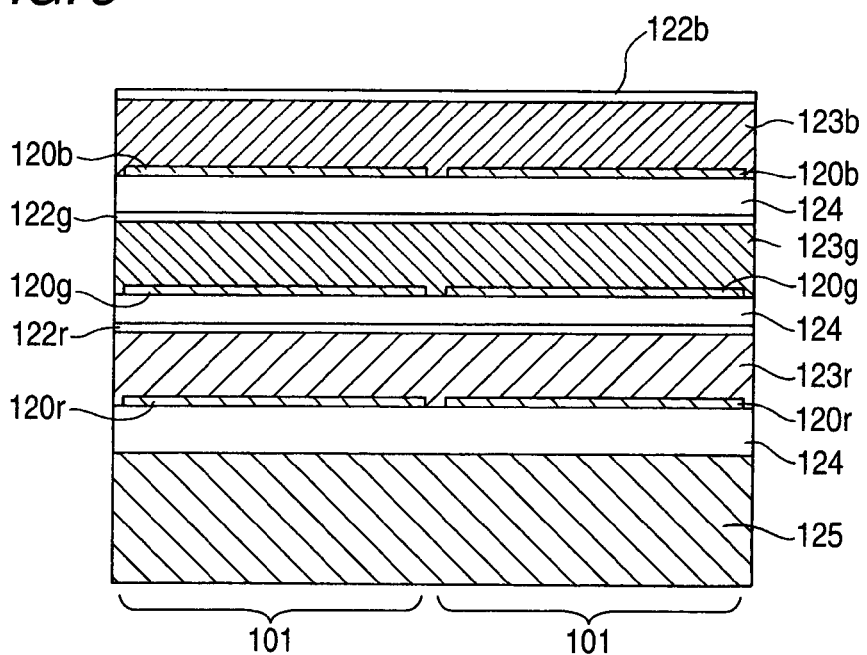
FIG. 3 is a typical sectional view taken along the line III-III in FIG. 2.

FIG. 3 is a typical sectional view taken along the line III-III in FIG. 2. A transparent insulator film 124 is first stacked on a semiconductor substrate 125. An electrode film (hereinafter referred to as pixel electrode film) 120r partitioned in accordance with each of the photo acceptance portions 101 is then stacked on the transparent insulator film 124. A photoelectric conversion film 123r for detecting red (R) is then stacked on the pixel electrode film 120r. The photoelectric conversion film 123r need not be partitioned in accordance with each of the photo acceptance portions 101. That is, the photoelectric conversion film 123r is stacked as a single sheet on the whole of a photo acceptance surface formed by a set of all the photo acceptance portions 101. Pixel electrode films constituted by all the pixel electrode film 120r are arranged in the form of the tetragonal lattice on the whole of the photo acceptance surface.

A common electrode film 122r which is common to the respective photo acceptance portions 101 for detecting red signals is stacked likewise as a single sheet on the photoelectric conversion film 123r to form a layered product for red. A transparent insulator film 124 is then stacked on the common electrode film 122r.

A pixel electrode film 120g partitioned in accordance with each of the photo acceptance portions 101 is stacked on the insulator film 124. A photoelectric conversion film 123g for detecting green (G) is stacked as a single sheet on the pixel electrode film 120g in the same manner as described above. A common electrode film 122g is then stacked on the photoelectric conversion film 123g to form a layered product for green. A transparent insulator film 124 is then stacked on the common electrode film 122g.

A pixel electrode film 120b partitioned in accordance with each of the photo acceptance portions 101 is stacked on the insulator film 124. A photoelectric conversion film 123b for detecting blue (B) is stacked as a single sheet on the pixel electrode film 120b in the same manner as described above. A common electrode film 122b is then stacked on the photoelectric conversion film 123b to form a layered product for blue.

The pixel electrode films 120b, 120g and 120r in accordance with one of the photo acceptance portions 101 are arranged in a line with respect to an incident direction of an incident light (i.e., approximately in a direction perpendicular to a surface of the semiconductor substrate). The solid-state imaging device 100 according to the embodiment is configured so that the three colors of red (R), green (G) and blue (B) are detected by each photo acceptance portion 101. The simply described term "pixel" hereinafter means a photo acceptance portion 101 for detecting the three colors whereas the described term "color pixel", "red pixel", "green pixel" or "blue pixel" means a partial pixel (i.e. the portion of a photoelectric conversion film sandwiched between a common electrode film and a pixel electrode film) for detecting corresponding one of the colors.

Each connection portion 121b shown in FIG. 2 is connected to a blue pixel electrode film 120b. Each connection portion 121g shown in FIG. 2 is connected to a green pixel electrode film 120g. Each connection portion 121r shown in FIG. 2 is connected to a red pixel electrode film 120r. The electrode terminals 109, 110 and 111 depicted in FIG. 1 are connected to the common electrode films 122b, 122g and 122r respectively.

A tin oxide ($SnO_2$) thin film, a titanium oxide ($TiO_2$) thin film, an indium oxide ($InO_2$) thin film or an indium titanium oxide (ITO) thin film may be used as each of the homogeneous transparent electrode films 122r, 122g, 122b, 120r, 120g and 120b. The homogeneous transparent electrode film is not limited thereto.

A single layer film or a multilayer film may be used as each of the photoelectric conversion films 123r, 123g and 123b. Various materials can be used as the materials of the photoelectric conversion films 123r, 123g and 123b. Examples of the materials include: inorganic materials such as silicon or compound semiconductor; organic materials containing organic semiconductor, organic pigment, etc.; quantum dot-deposited films made from nano particles.

Figure 4:
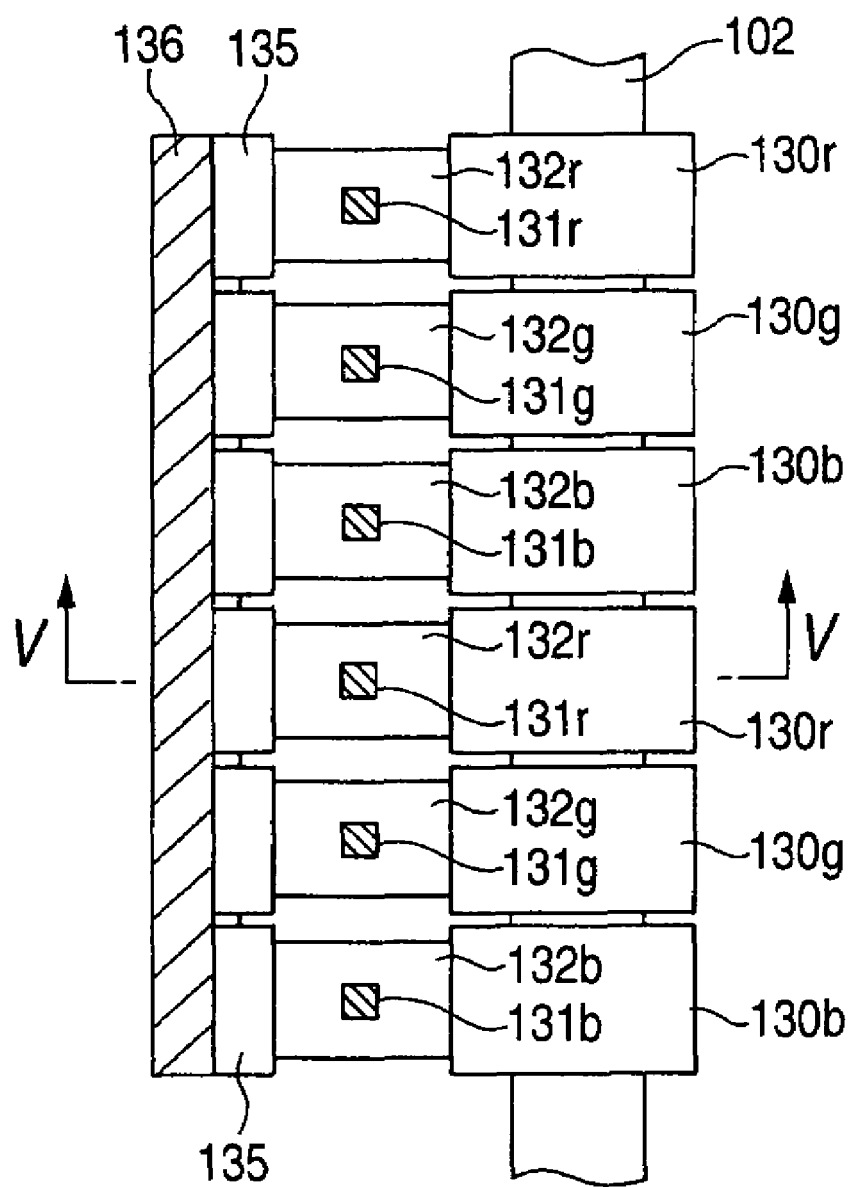
FIG. 4 is a typical view of a surface of a semiconductor showing a state in which photoelectric conversion films, etc. stacked on a semiconductor substrate have been removed from the state of FIG. 2.

FIG. 4 is a typical view of a surface of the semiconductor substrate showing a state in which layers including and above the lowest insulator film 124 shown in FIG. 3 (i.e. including and above a light shielding film 144 which will be described later) have been removed from the state shown in FIG. 2. Three transfer electrodes 130r, 130g and 130b are provided for each pixel 101. A charge-storage region (i.e., a signal charge-storage region) 132r for accumulating signal charges generated in a red pixel part of the pixel 101 is formed on the left side of the transfer electrode 130r. A charge-storage region 132g for accumulating signal charges generated in a green pixel part of the pixel 101 is formed on the left side of the transfer electrode 130g. A charge-storage region 132b for accumulating signal charges generated in a blue pixel part of the pixel 101 is formed on the left side of the transfer electrode 130b.

A transfer channel 102 is provided under the respective transfer electrodes 130r, 130g and 130b. A potential barrier is provided between the charge transfer channel 102 and each of the charge-storage regions 132r, 132g and 132b. The transfer electrodes 130r, 130g and 130b extend over corresponding electric potential barriers to end portions of the charge-storage regions 132r, 132g and 132b, respectively. That is, the transfer electrodes 130r, 130g and 130b serve also as readout electrodes for reading out red, green and blue signal charges, respectively.

Figure 13A:
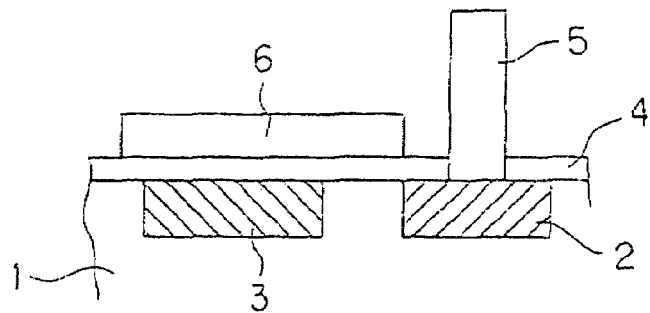
FIGS. 13A to 13C are views for explaining transfer of electric charges in a solid-state imaging device according to the related art.
Figure 13B:
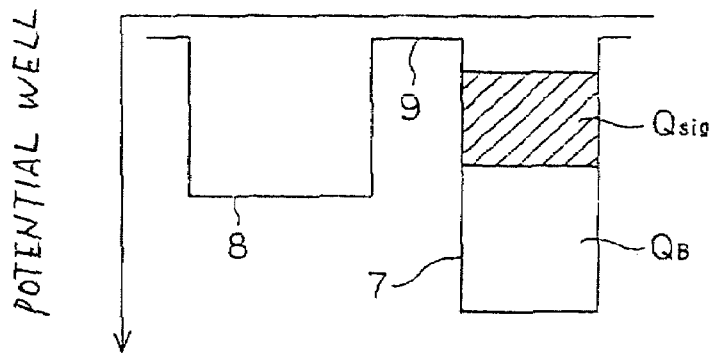
Figure 13C:
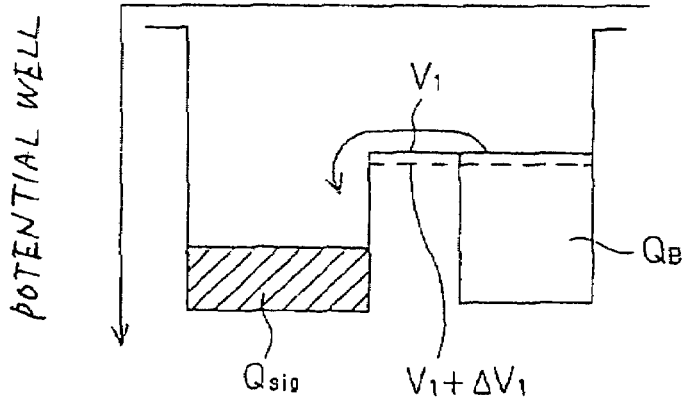

Connection portions 131r, 131g and 131b connected to columnar wiring electrodes the same as those described in FIGS. 13A to 13C are provided in the centers of the charge-storage regions 132r, 132g and 132b, respectively. The connection portions 131r, 131g and 131b are connected to the red pixel electrode film 120r, the green pixel electrode film 120g and the blue pixel electrode film 120b, respectively. The connection portions 131r, 131g and 131b form $n^+$ regions in surface portions of n-type semiconductor regions constituting the signal charge-storage regions, so that the connection portions 131r, 131g and 131b can ohmically contact the wiring electrodes respectively. For this reason, a large number of free electrons QB are located in each of the wiring connection portions 131r, 131g and 131b.

Charge draining control electrodes 135 each made of a multilayer silicon sheet are provided on the left sides of the charge-storage regions 132r, 132g and 132b, respectively. The charge draining control electrodes 135 are connected to the charge draining control electrode terminal 115 shown in FIG. 1. A lateral overflow drain 136 made of a high-density impurity region (n$^+$ region) is formed on the left sides of the charge draining control electrodes.

Figure 5:
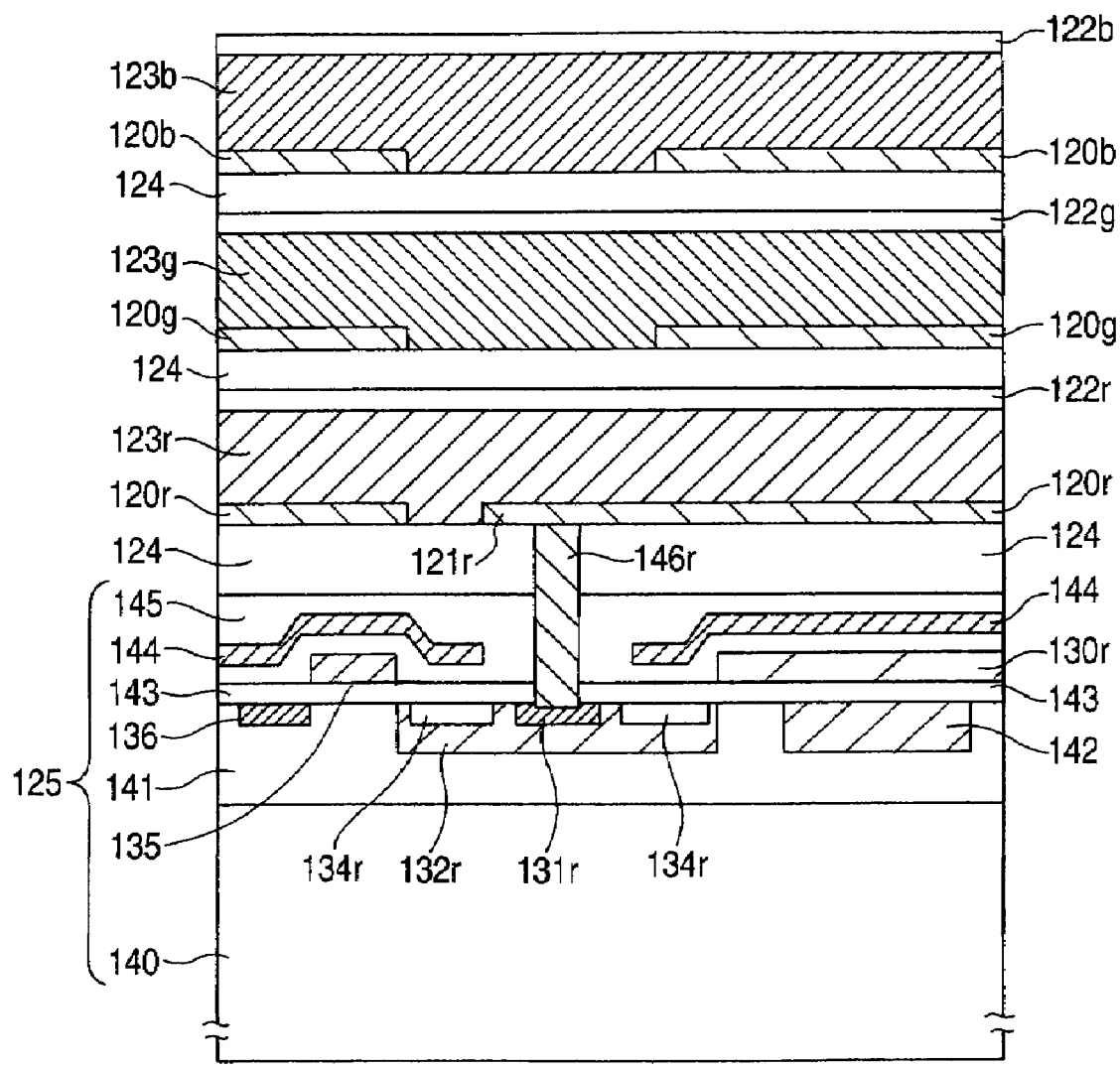
FIG. 5 is a typical sectional view taken along the line V-V in FIG. 4.

FIG. 5 is a typical sectional view taken along the line V-V in FIG. 4. That is, FIG. 5 is a view including a section of a portion stacked on the semiconductor substrate 125 shown in FIG. 3. A P-well layer 141 is formed on a surface portion of an n-type semiconductor substrate 140. An n-type semiconductor region 142 that is a charge transfer channel transferring signal charges in the column direction, a red signal charge-storage region 132r having the aforementioned connection portion 131r formed in its central surface portion, and the lateral overflow drain 136 are formed in the P-well layer 141.

A gate insulator film 143 is formed on the surface of the P-well layer 141. A charge draining control electrode 135 and a transfer electrode (readout electrode) 130r are formed on the gate insulator film 143. A columnar wiring electrode 146r piercing the gate electrically insulating film 143 and extending to a connection portion 121r of a red pixel electrode film 120r shown in FIG. 2 is formed on the connection portion 131r.

An insulator film 145 is stacked on the charge draining control electrode 135 and the transfer electrode 130r. A light shielding film 144 is buried in the insulator film 145. The lowest insulator film 124 shown in FIG. 3 is stacked on the insulator film 145. The semiconductor substrate 125 shown in FIG. 3 is equivalent to a substrate ranging from the n-type semiconductor substrate 140 to the insulator film 145 in FIG. 5.

Moreover, in the solid image sensing device according to this embodiment, high-density p-type impurity portions (p$^+$ regions) 134r as a potential barrier unit are provided on the surface side of the signal charge-storage region 132r made of an n-type semiconductor region.

The signal charge-storage region 132r is formed so that an end portion of the lateral overflow drain 136 is covered with an end portion of the charge draining control electrode 135, and that an end portion of the charge transfer channel 142 is covered with an end portion of the transfer electrode 130r.

The p-type impurity portions 134r are provided at the periphery of the connection portion 131r. More specifically, in the solid image sensing device according to this embodiment, the p-type impurity portions 134r are provided to extend from a position not overlapping the transfer electrode 130r to a position near the center position (i.e., the connection portion 131r), and to extend from a position not overlapping the charged raining control electrode 135 to a position near the center position, respectively.

Because FIG. 5 is a typical sectional view taken along the line V-V in FIG. 4, the wiring electrode 146r connected to the red pixel electrode film 120r is shown in FIG. 5. A wiring electrode extending to the green pixel electrode film 120g and a wiring electrode extending to the blue pixel electrode film 120b are provided so as to be erected on the rear side and the front side of the illustrated wiring electrode 146r in a plane of FIG. 5.

The arrangement positions and structures of the signal charge-storage region 132r, the transfer electrode 130r, the charge transfer channel 142, the charge draining control electrode 135 and the lateral overflow drain 136 around the red (R) wiring electrode 146r can be applied to those around the other color wiring electrodes.

Figure 6A:
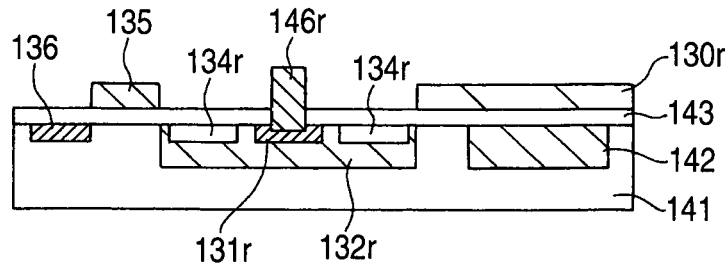
FIGS. 6A to 6D are views for explaining transfer of electric charges in solid-state imaging device according to the first embodiment of the invention.
Figure 6B:
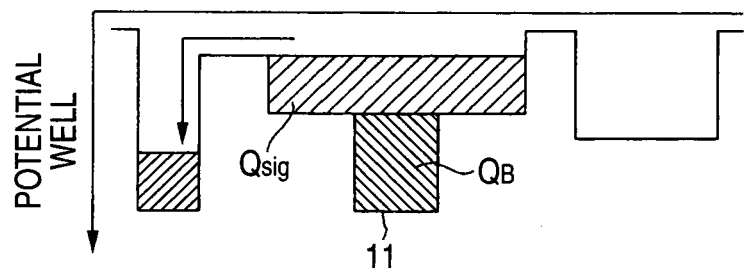

FIGS. 6A to 6D are views for explaining transfer of charges in the structure shown in FIG. 5. FIG. 6A is a view of the structure of main part extracted from FIG. 5. FIG. 6B shows a state of a potential well when the transfer electrode 130r or the charge draining control electrode 135 is not supplied with any readout pulse or any charge draining control voltage.

A voltage is applied to the red pixel electrode film 120r for generating a drift electric field so that electric charges optically generated even for a very bright subject image can be transferred rapidly from the photoelectric conversion film 123r to the red signal charge-storage region 132r, and that an overflow of the electric charges from a well 11 formed in the red signal charge-storage region 132r can be drained to the overflow drain 136.

There are a large number of free electrons QB in a deep portion of the center portion of the well 11. The diameter of an upper portion of the well 11 is enlarged to the same size as that of the signal charge-storage region 132r. Signal charges Qsig flowing out of the photoelectric conversion film 123r are accumulated in the enlarged diameter portion, so that a surplus of the charges can be drained to the overflow drain 136.

Figure 6C:
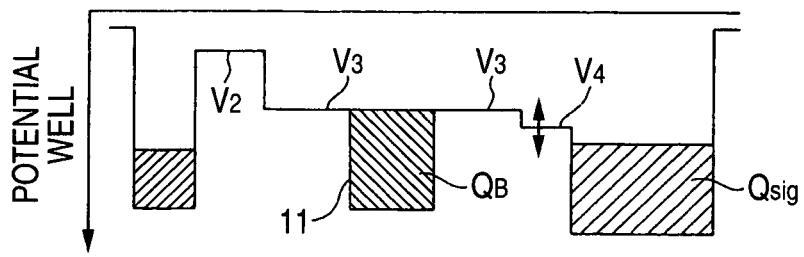

When a readout pulse with a potential V4 is applied to the readout electrode (transfer electrode) 130r after a time has passed since the timing of opening of an electronic shutter which will be described later, the level of a potential barrier formed under an end portion of the readout electrode 130r becomes lower than the level of a potential barrier V3 decided by the thickness and impurity density of the p-type impurity portion 134r and the thickness and impurity density of the signal charge-storage region 132r under the p-type impurity portion 134r as shown in FIG. 6C. As a result, the signal charges Qsig accumulated in the well 11 are read out into the well of the charge transfer channel 142 and then transferred to the horizontal transfer channel 103 (FIG. 1) along the vertical transfer channel 102.

Here, even when the potential barrier V4 shown in FIG. 6C varies in accordance with fluctuation in the potential of the readout pulse, the free electrons QB held in the center portion of the well 11 are never mixed with the signal charges Qsig transferred to the charge transfer channel 142 because the level of the potential barrier V3 surrounding the well 11 is kept constant, that is, because the free electrons QB are retained by the constant potential barrier V3 decided by the impurity density, etc. of the p-type impurity portion 134r.

Figure 6D:
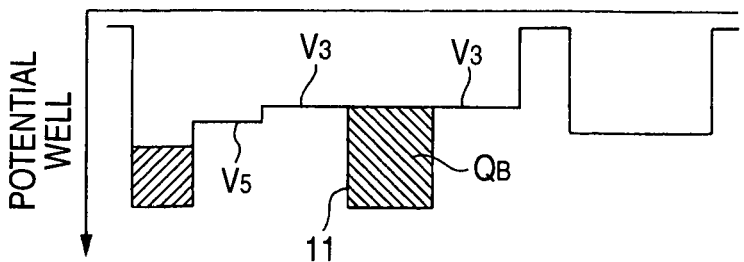

When an electric potential V5 is applied to the charge draining control electrode 135, the level of the potential barrier formed under the charge draining control 135 becomes lower than the level of the potential barrier V3 decided by the impurity density, etc. of the p-type impurity portion 134r as shown in FIG. 6D. As a result, the charges in the well 11 are drained to the overflow drain 136, so that the enlarged diameter portion of the well 11 for accumulating signal charges becomes empty (the electronic shutter is "closed").

When the potential of the charge draining control 135 is restored to the original potential V2 after the signal charges accumulated in the well 11 are eliminated, the electronic shutter is "opened" so that the signal charges Qsig coming from the photoelectric conversion film 123r are newly accumulated in the well 11.

When the signal charges in the well 11 are drained to the lateral overflow drain 136, the amount of free electrons QB remaining in the well 11 is kept constant by the potential barrier V3. Accordingly, even when the potential applied to the charge draining control 135 fluctuates in this case, the fluctuation never causes fluctuation in the amount of the accumulated signal charges Qsig.

Second Embodiment

Figure 7:
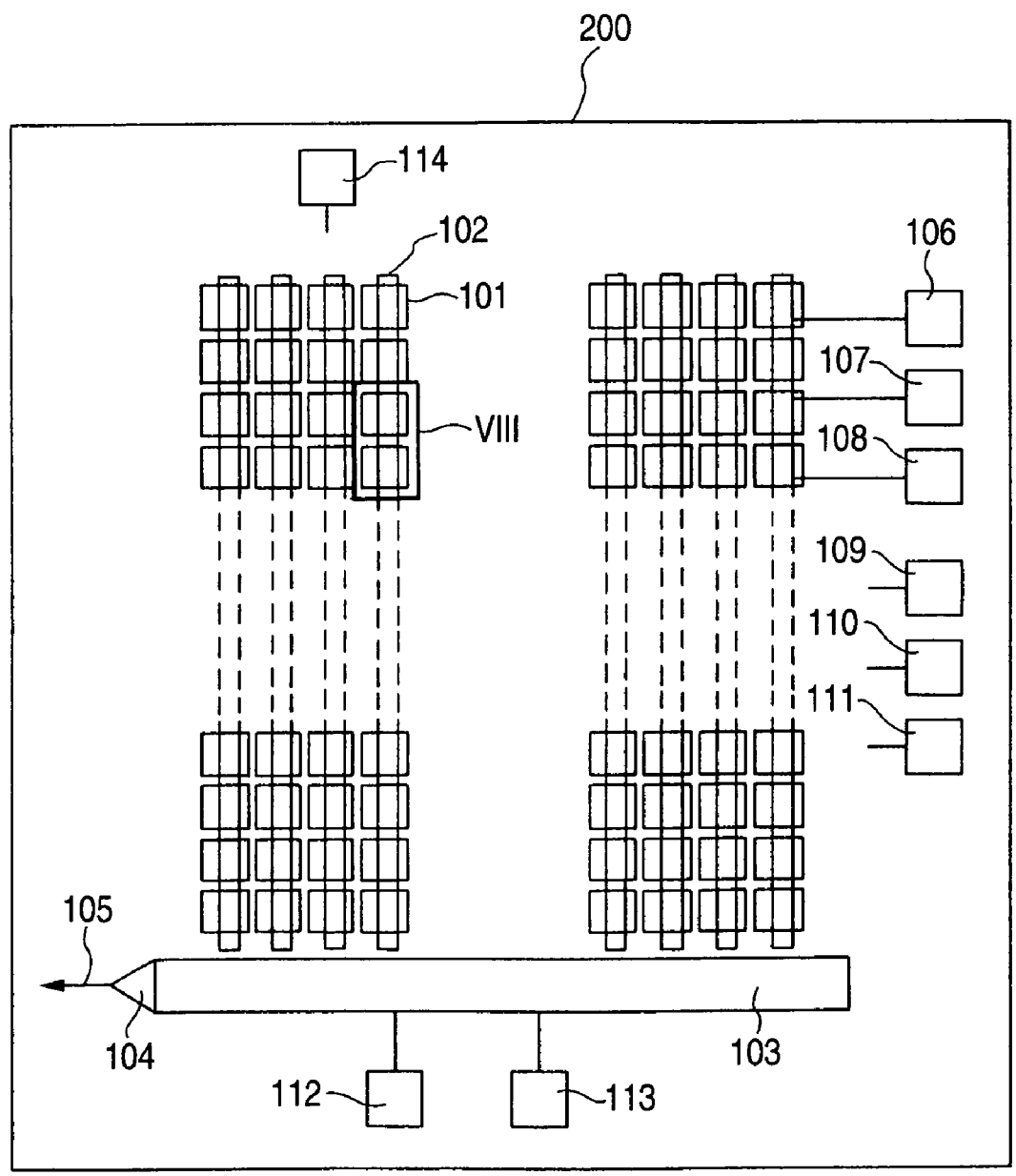
FIG. 7 is a typical view of a surface of a solid-state imaging device according to a second embodiment of the invention.

FIG. 7 is a typical view showing a surface of a solid-state imaging device according to a second embodiment of the invention. The solid-state imaging device 200 is different from the solid-state imaging device 100 according to the first embodiment shown in FIG. 1 in that a vertical overflow drain is used. The structure of the surface in this embodiment is almost the same as that in the first embodiment. For this reason, constituent members the same as those in the first embodiment are referred to by numerals the same as those in the first embodiment, and the description thereof will be omitted. In this embodiment, there is no charge draining control electrode terminal 115 provided since the vertical overflow drain is used.

Figure 8:
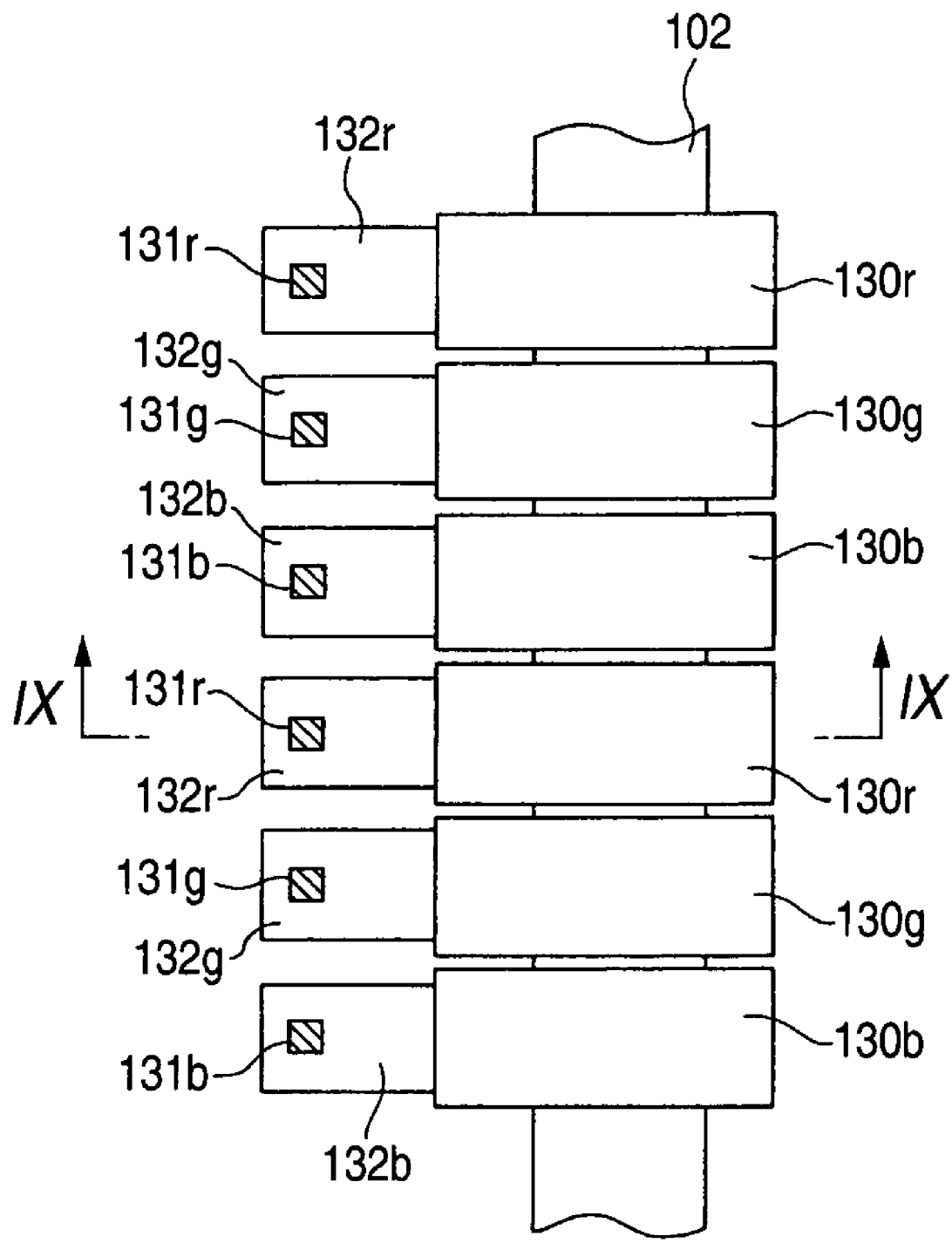
FIG. 8 is a typical enlarged view of a portion enclosed in a rectangular frame VIII shown in FIG. 7.

FIG. 8 is a view like FIG. 4, showing a portion enclosed in a rectangular frame VIII shown in FIG. 7. Since the configuration is almost the same as that of the first embodiment in FIG. 4, constituent members the same as those in the first embodiment are referred to as numerals the same as those in the first embodiment and the description thereof will be omitted here. FIG. 8 is different in structure from FIG. 4 in that the electrodes 135 and the drain 136 required because of the lateral overflow drain are not provided in FIG. 8.

Figure 9:
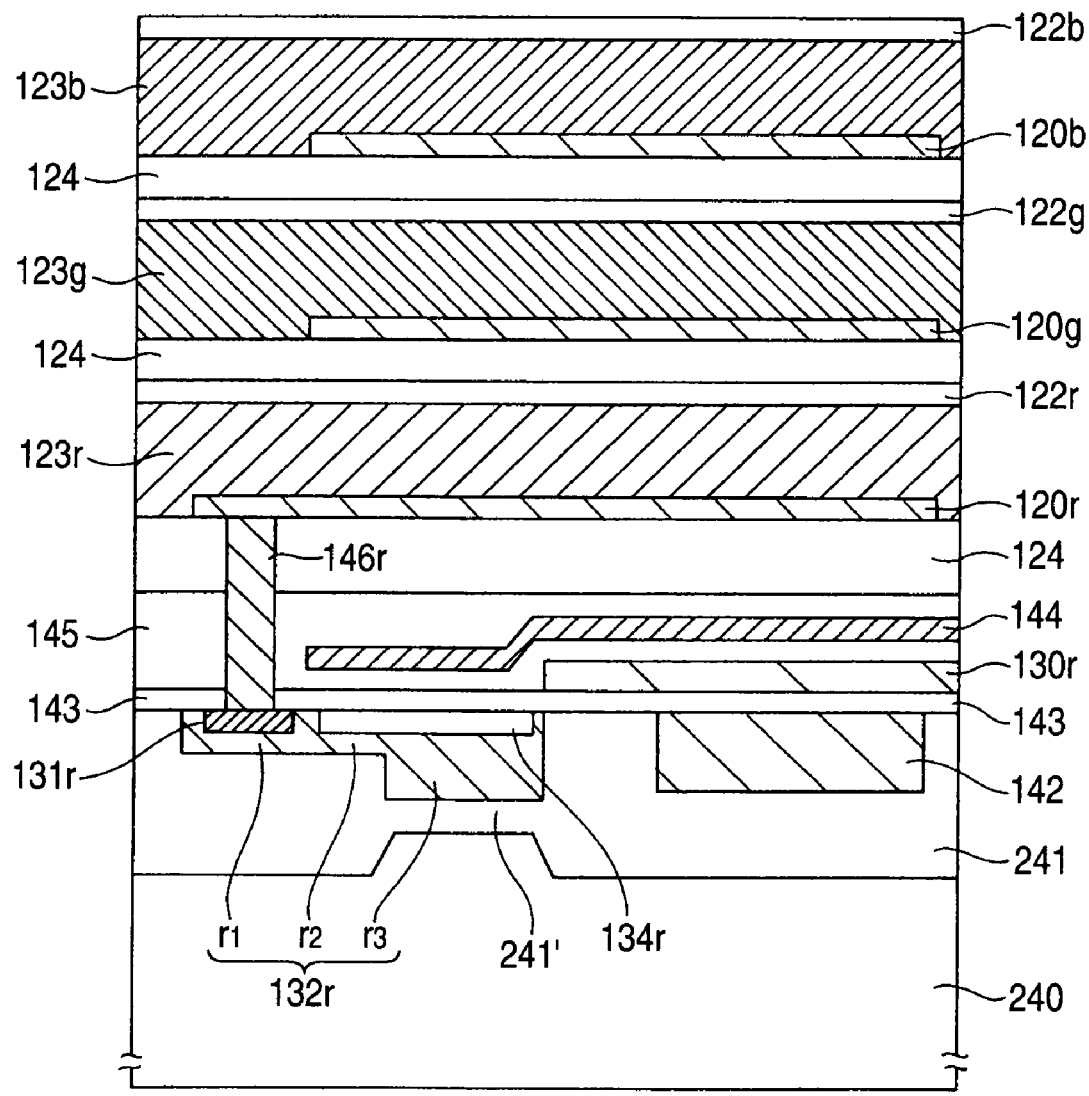
FIG. 9 is a typical sectional view taken along the line IX-IX in FIG. 8.

FIG. 9 is a typical sectional view taken along the line IX-IX in FIG. 8. Since the configuration of a gate insulator film 143 and films above the gate insulator film 143 is the same as that in FIG. 5, constituent members the same as those in FIG. 5 are referred to as numerals the same as those in FIG. 5 and the description thereof will be omitted.

A P-well layer 241 is formed on the surface side of an n-type semiconductor substrate 240. A charge transfer channel 142 is provided on the surface side of the P-well layer 241 and below a transfer electrode (a readout electrode) 130*r*. A signal charge-storage region 132*r* made of an n-type semiconductor region and extending to the transfer electrode 130*r* is formed in a connection portion 131*r* of a columnar wiring electrode 146*r*.

A p-type impurity portion (a potential barrier unit) 134*r* is formed on the surface portion of the signal charge-storage region 132*r* on the side of the transfer electrode 130*r*. The signal charge-storage region 132*r* made of an n-type semiconductor region includes a region r1 provided as a thin n-type semiconductor region located under the connection portion 131*r*, a region r2 connected to the region r1 and provided as a thin n-type semiconductor region located under the p-type impurity portion 134*r*, and a region r3 connected to the region r2 and provided as a depth wise thick n-type semiconductor region located under the p-type impurity portion 134*r*. The n-type semiconductor region reaches a gate insulator film 143 in an end portion of the region r3, the end portion of the region r3 facing to the transfer electrode 130*r*, and the end portion of the region r3 over laps an end portion of the transfer electrode 130*r*.

In the signal charge-storage region 132*r* configured as described above, the regions r1 and r2 serve as charge paths because the charge-storage function of the regions r1 and r2 is low. A large part of signal charges are accumulated in the region r3 (i.e., the region r3 serve as a body of the signal charge-storage region).

The P-well layer 241 is formed so that its portion 241' under the region r3 is thin. For this reason, the region r3 of the n-type semiconductor region and an n-type semiconductor region of a substrate can approach each other.

Figure 10A:
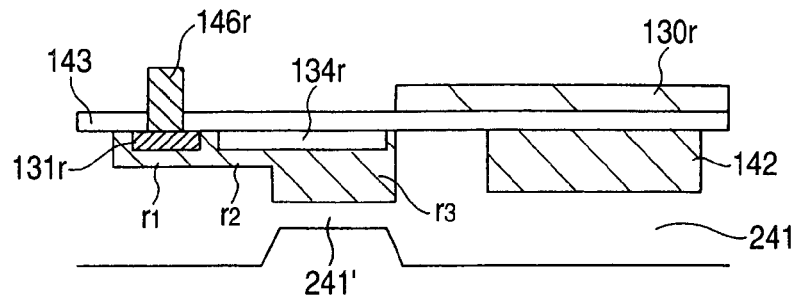
FIGS. 10A to 10D are views for explaining transfer of electric charges in the solid-state imaging device according to the second embodiment of the invention.
Figure 10B:
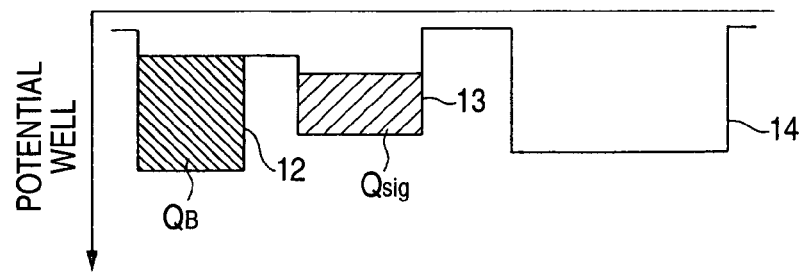

FIGS. 10A to 10D are views for explaining transfer of charges in the structure shown in FIG. 9. FIG. 10A is a view of the structure of a main portion extracted from FIG. 9. FIG. 10B is a view showing a potential well in the structure of FIG. 10A. Free electrons QB are accumulated in a well 12 formed just under a wiring electrode 146*r*. The free electrons QB are never leaked out because they are held by a potential barrier decided by the impurity density, etc. of the p-type impurity portion 134*r* formed on the thin region r2.

Signal charges Qsig flowing out from a photoelectric conversion film pass through the wiring electrode 146*r*, the connection portion 131*r*, the region r1, the region r2 and the region r3 successively and are accumulated in a well 13 formed under the region r3.

Figure 10C:
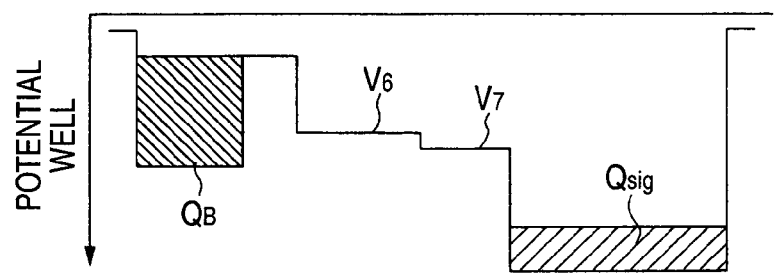
Figure 10D:
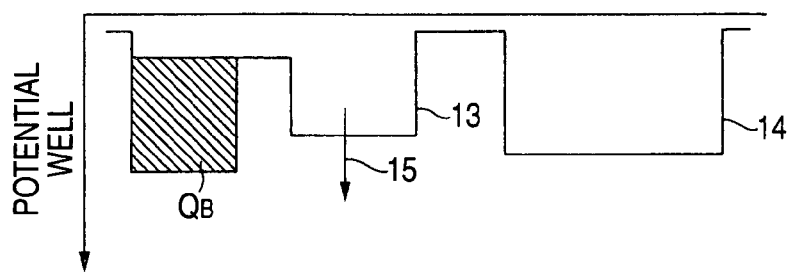

When a readout pulse is applied to the readout electrode (transfer electrode) 130*r* so that a potential barrier between the well 13 and a well 14 formed under the charge transfer channel 142 is moved down as shown in FIG. 10C, signal charges Qsig in the well 13 are read out into the well 14 and then transferred along a vertical transfer channel.

Even when the potential of the readout pulse fluctuates, the signal charges Qsig can be prevented from remaining in the well 13 because the level of a potential barrier V7 between the wells 13 and 14 at the time of application of the readout pulse can be made surely lower than a potential V6 of the well 13 if the potential of the readout pulse is set in consideration of the fluctuation.

To drain the charges accumulated in the well 13, a voltage is applied to the n-type semiconductor substrate 240. As a result, the signal charges Qsig in the well 13 pass through the thin portion 241' of the P-well layer 241 and are drained in the direction of an arrow 15, that is, to the n-type semiconductor substrate 240.

In the embodiment as described above, the whole of the signal charge-storage region 132*r* is not set as a signal charge-storage region but is partitioned into the region r2 (a charge path) for forming a potential barrier and the region r3 (a body) for accumulating charges. Accordingly, there can be obtained an advantage that the signal charges can be rapidly read out into the transfer channel so that an after-image phenomenon can be suppressed. Since the vertical overflow drain structure is used, there is also an advantage that an image sensor with smaller pixels can be attained.

Third Embodiment

Figure 11:
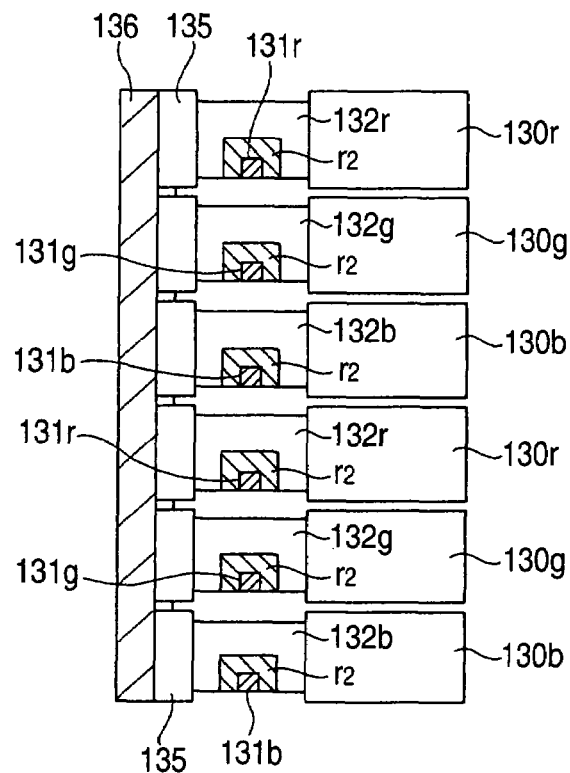
FIG. 11 is a view like FIG. 4, showing a solid-state imaging device according to a third embodiment of the invention.

FIG. 11 is a view like FIG. 4, showing a solid-state imaging device according to a third embodiment of the invention. Since the embodiment also has a lateral overflow drain structure, charge draining control electrodes 135 and a lateral overflow drain 136 are provided in the embodiment.

In the first embodiment, the size (depth) of the signal charge-storage region 132*r* is made so uniform that signal charges can be accumulated in the whole of the region 132*r* as shown in FIG. 6A. On the contrary, in the second embodiment, the regions r1 and r2 (charge paths) in the signal charge-storage region 132*r* (r1+r2+r3) are made so thin that a potential barrier can be formed in the portion of the region r2 while signal charges can be mainly accumulated in the region r3 (a body of the signal charge-storage region).

This embodiment is obtained by applying the configuration of the second embodiment to the first embodiment. In this embodiment, the signal charge-storage region 132*r* is partitioned into a potential barrier region (a charge path) and a charge-storage region in such a manner that a thin n-type semiconductor region around a connection portion 131r connected to a wiring electrode 146r is provided as a region r2 while a portion of the signal charge-storage region 132r surrounding the region r2 is deepened. Thus, readout of signal charges and draining of unnecessary charges into the overflow drain can be performed rapidly.

Incidentally, in the embodiment shown in FIG. 11, the place of the connection portion 131r connected to the wiring electrode 146r is brought near to an edge of the signal charge-storage region 132r. In this manner, parts around the connection portion 131r can be produced easily.

Fourth Embodiment

Figure 12:
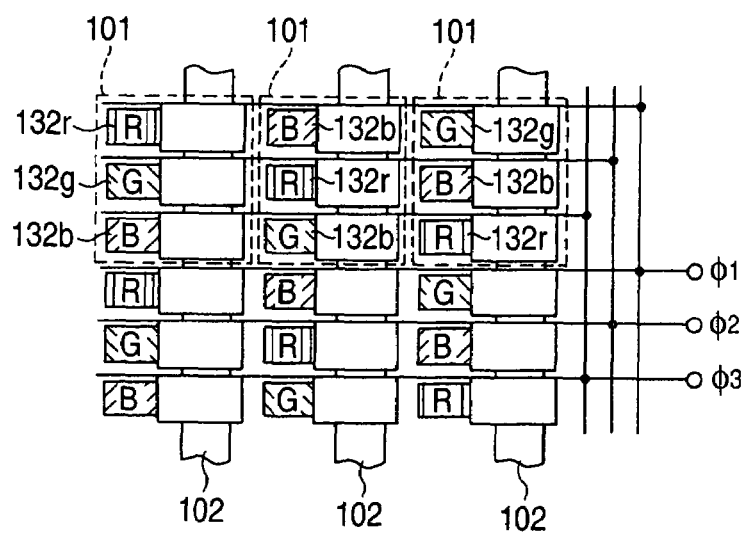
FIG. 12 is a typical plan view showing six pixel parts in a solid-state imaging device according to a fourth embodiment of the invention.

FIG. 12 is a typical plan view showing six pixel parts in a solid-state imaging device according a fourth embodiment of the invention. In the solid-state imaging device according to each of the aforementioned embodiments, signals of the three colors of red (R), green (G) and blue (B) can be readout from each pixel. Therefore, the red signal charge-storage region 132r, the green signal charge-storage region 132g and the blue signal charge-storage region 132b are provided under pixel parts respectively so as to be arranged in the order of R, G and B, for example, as shown in FIG. 8. The red, green and blue signal charge-storage regions are also provided for each of all adjacent pixels in the order of R, G and B.

On the contrary, in this embodiment, the sequence of the signal charge-storage portions arranged in the column direction is cyclically changed with respect to the pixels arranged in the row direction as shown in FIG. 12. That is, when signal charge-storage regions 132r, 132g and 132b are provided in the order of R, G and B in a first pixel 101 as shown in FIG. 12, signal charge-storage regions 132b, 132r and 132g are provided in the order of B, R and G in a second pixel 101 horizontally adjacent to the first pixel 101 (i.e., the first and second pixels 101 are arranged in the row direction) and signal charge-storage regions 132g, 132b and 132r are provided in the order of G, B and R in a third pixel 101 horizontally adjacent to the second pixel 101 (i.e., the second and third pixels 101 are arranged in the row direction).

In this manner, when any one of transfer pulses φ1, φ2, and φ3 is applied, signals of the three colors of R, G and B are read out simultaneously from three pixels 101 arranged horizontally (i.e., in the row direction). When the solid-state imaging device is mounted in a digital still camera and only used for capturing a high-resolution still image, signal charge-storage regions need not be arranged as shown in FIG. 12. However, when it is necessary to generate motion picture data by thinning image data, data of the three colors of R, G and B can be obtained without any time difference if signal charge-storage regions are arranged as shown in FIG. 12. That is, even if motion picture data are generated by thinning image data, the motion picture data can be prevented from becoming unnatural in terms of color.

When pixels from which data are to be read out are selected for generating motion picture data without thinning of image data once read out, the readout time can be reduced to ⅓ because data of the three colors of R, G and B can be read out without any time difference.

Although the respective embodiments have been described on the case where three layers of photoelectric conversion films are provided so that incident light is detected while the color of the incident light is separated into the three primary colors of R, G and B, the invention may be applied to the case where a fourth photoelectric conversion film for detecting an intermediate color between green and blue besides R, G and B is additionally provided so that incident light is detected while the color of the incident light is separated into four colors. In this case, color reproducibility can be improved because color separation can be made more finely.

Although the respective embodiments have been described on the case where photoelectric conversion films for detecting blue, green and red incident light components are provided in increasing order of wavelength viewed from above the solid-state imaging device, the arrangement sequence of photoelectric conversion films is not limited thereto. Although a common electrode film and a corresponding pixel electrode film are provided so that each photoelectric conversion film is sandwiched between the common electrode film and the corresponding pixel electrode film, the common electrode film need not be provided on the upper side of the photoelectric conversion film, that is, the common electrode film may be provided on the lower side of the photoelectric conversion film.

Although each of all the pixel electrode films and common electrode films is made of a transparent or low-light-absorption material, only the electrode film nearest to the semiconductor substrate may be made of an opaque material.

Although the respective embodiments have been described on the case where one signal charge-storage region corresponds to one transfer electrode of a CCD register in the vertical transfer channel, one signal charge-storage region may correspond to a plurality of transfer electrodes of a CCD register. This is effective in the case where the pixel size is large. For example, when a CCD register in the vertical transfer channel is four-phase-driven in the condition that one signal charge-storage region corresponds to four transfer electrodes, there is an advantage that signal charges of all pixels can read out by one readout operation.

Although the respective embodiments have been described on the case where the CCD register in the vertical transfer channel is three-phase-driven, the number of phases used for driving the CCD register may be changed to a multiple of 3. For example, when a CCD register is six-phase-driven, signal charges of all pixels can be read out in six readout operations. Accordingly, the amount of charges allowed to be transferred by the CCD register in the vertical direction can be increased to about four times, so that there is an advantage that a large-power saturated output signal can be obtained. Although four-phase driving is normally used in the four-layer structure of four photoelectric conversion films, eight-phase driving may be used likewise.

As described above, each of the embodiments of the invention is configured as follows. Potential barrier forming units and signal charge-storage units are provided near to connection portions (designated by the reference numerals 131r, 131g and 131b in the embodiment) of photoelectric conversion films connected to pixel electrode films so that constant potential barriers to electric charges can be formed. Readout gates are provided near to the charge-storage units for reading out signal charges into a CCD register in a vertical transfer channel. An unnecessary charge draining unit is provided near to the signal charge-storage units for draining unnecessary charges. Accordingly, in this structure, noise can be prevented from being generated in the readout signal charges even if voltage fluctuation or noise is superposed on a readout pulse. Moreover, this structure is provided with an electronic shutter function. A good output signal can be obtained even if the electronic shutter operates. In addition, a color image sensing device with a three-layer or four-layer structure can be achieved easily. Configuration may be made so that signal charges corresponding to different color signals in one pixel position can be read out in one and the same vertical transfer channel. It is easy to make each pixel finer.

The solid-state imaging device according to the invention has an advantage that the device can be used in place of a CCD type or CMOS type image sensor used heretofore, and that signals of the three colors of red, green and blue can be obtained from one pixel without use of any color filter. Accordingly, the solid-state imaging device according to the invention is useful when mounted in a digital camera, etc.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

The present application claims foreign priority based on Japanese Patent Application No. JP2004-77693, filed Mar. 18 of 2004, the contents of which is incorporated herein by reference.

What is claimed is:

1. A solid-state imaging device comprising:
   a semiconductor substrate having a signal charge-storage region and a signal readout circuit, the signal readout circuit comprising a charge coupled element;
   a photoelectric conversion film that converts an incident light into a signal charge in accordance with an intensity of the incident light, wherein the signal charge-storage region accumulates the signal charge, and the signal readout circuit reads out and outputs the signal charge;
   a wiring electrode that leads the signal charge from the photoelectric conversion film to the signal charge-storage region;
   a connection portion that connects the wiring electrode to the signal charge-storage region; and
   a potential barrier unit disposed at the periphery of the connection portion, wherein the potential barrier unit serves as a potential barrier against a charge in the connection portion.

2. The solid-state imaging device according to claim 1, which comprises a charge draining unit that drains the signal charge accumulated in the signal charge-storage region, and the charge draining unit is disposed near the signal charge-storage region.

3. The solid-state imaging device according to claim 2, wherein the charge draining unit has a lateral overflow drain structure or a vertical overflow drain structure.

4. The solid-state imaging device according to claim 1, wherein the potential barrier unit comprises an impurity portion at the periphery of the connection portion, the impurity portion having a conductivity type opposite to that of the connection portion and the signal charge-storage region.

5. The solid-state imaging device according to claim 4, wherein the signal charge-storage region comprises: a body storing the signal charge; and a charge path that leads the signal charge to the body, wherein the charge path overlaps the impurity portion near the connection portion, and the charge path has a thickness smaller than that of the body so that the charge accumulated in the connection portion are held by the potential barrier in the charge path.

6. The solid-state imaging device according to claim 1, wherein the signal readout circuit comprises:
   a set of column-direction CCD registers, each of the column-direction CCD registers comprising: a readout electrode that reads out the signal charge from the signal charge-storage region; and a transfer channel that transfers the signal charge sequentially in a column direction of the column-direction CCD registers;
   a row-direction CCD register that receives the signal charge from each of the column-direction CCD registers and transfers the signal charge sequentially in a row direction of the row-direction CCD register; and
   an output portion located at one end of the row-direction CCD register, wherein the output portion detects the signal charge transferred from the row-direction CCD register and outputs the signal charge as an output signal.

7. The solid-state imaging device according to claim 1, which comprises a plurality of photo acceptance portions arranged in a planar array on a surface portion of the solid-state imaging device,
   the solid-state imaging device comprising a plurality of sets of layered products, wherein the sets of the layered products are stacked in a direction perpendicular to a surface of the semiconductor substrate, each of the layered products comprising:
   a common electrode film to pixels;
   a plurality of pixel electrode films arranged in the planar array, each of the pixel electrode films being partitioned in accordance with one of the pixels; and
   the photoelectric conversion film between the common electrode film and the pixel electrode films arranged in the planar array,
   wherein
   the photoelectric conversion film of each of the layered products detects the incident light differing in wavelength between the layered products,
   the pixel electrode films in each position of the planar array are arranged in a line with respect to an incidence direction of the incident light, and
   the pixel electrode films in each position of the planar array form one partition unit of the photo acceptance portions.

8. The solid-state imaging device according to claim 6, which comprises a plurality of photo acceptance portions arranged in a planar array on a surface portion of the solid-state imaging device,
   the solid-state imaging device comprising a plurality of sets of layered products, wherein the sets of the layered products are stacked in a direction perpendicular to a surface of the semiconductor substrate, each of the layered products comprising:
   a common electrode film to pixels;
   a plurality of pixel electrode films arranged in the planar array, each of the pixel electrode films being partitioned in accordance with one of the pixels; and
   the photoelectric conversion film between the common electrode film and the pixel electrode films arranged in the planar array,
   wherein
   the photoelectric conversion film of each of the layered products detects the incident light differing in wavelength between the layered products,
   the pixel electrode films in each position of the planar array are arranged in a line with respect to an incidence direction of the incident light, and
   the pixel electrode films in each position of the planar array form one partition unit of the photo acceptance portions.

9. The solid-state image sensing device according to claim 8, wherein the semiconductor substrate has a plurality of sets of signal charge-storage regions;
   each of the sets of the signal charge-storage regions is disposed under one of the photo acceptance portions, and the signal charge-storage regions in each of the sets are arranged in a sequence with respect to the column direction;

each of the signal charge-storage regions accumulates the signal charge in accordance with a detection color of the photoelectric conversion film, and the signal charge-storage regions in each of the sets differ in the detection color from each other;

and one of the column-direction CCD registers reads out the signal charge accumulated in one of the sets of the signal charge-storage regions.

10. The solid-state imaging device according to claim 9, wherein the sequence of the signal charge-storage portions in the column direction is common to the photo acceptance portions.

11. The solid-state imaging device according to claim 9, wherein the sequence of the signal charge-storage portions arranged in the column direction is cyclically changed with respect to the photo acceptance portions arranged in the row direction.

12. The solid-state imaging device according to claims 7, wherein the layered products includes as the photoelectric conversion film:

a first photoelectric conversion film having a peak of spectral sensitivity characteristic at red;

a second photoelectric conversion film having a peak of spectral sensitivity characteristic at green; and a third photoelectric conversion film having a peak of spectral sensitivity characteristic at blue.

13. The solid-state imaging device according to claims 8, wherein the layered products includes as the photoelectric conversion film:

a first photoelectric conversion film having a peak of spectral sensitivity characteristic at red;

a second photoelectric conversion film having a peak of spectral sensitivity characteristic at green; and a third photoelectric conversion film having a peak of spectral sensitivity characteristic at blue.

* * * * *